(12) United States Patent
Miller et al.

(10) Patent No.: US 6,613,979 B1
(45) Date of Patent: *Sep. 2, 2003

(54) ELECTRICAL CIRCUIT SUSPENSION SYSTEM

(75) Inventors: Paul J. Miller, Albuquerque, NM (US); Kevin G. Foreman, Sandia Park, NM (US)

(73) Assignee: Quell Corporation, Albuquerque, NM (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/919,934

(22) Filed: Aug. 27, 1997

Related U.S. Application Data (62) Division of application No. 08/369,377, filed on Jan. 6, 1995, now Pat. No. 5,686,697.

(51) Int. Cl.[7] .................................................. H05K 5/06
(52) U.S. Cl. ...................... 174/52.2; 361/811; 174/262; 174/267; 174/260; 174/254
(58) Field of Search .......................... 29/848, 883, 884, 29/605; 439/620, 628; 174/52.2, 262, 267, 260, 254; 361/785, 789, 791, 811

(56) References Cited

U.S. PATENT DOCUMENTS

| | | | |
|---|---|---|---|
| 2,450,528 A | 10/1948 | Sprigg | 174/77 |
| 2,451,516 A | 10/1948 | Skobel | 174/151 |
| 3,004,170 A | 10/1961 | Greenspan | 307/10 |
| 3,086,188 A | 4/1963 | Ross | 339/49 |
| 3,569,915 A | 3/1971 | Sorenson et al. | 339/143 |
| 3,670,292 A | 6/1972 | Tracy | 339/143 R |
| 3,780,352 A | 12/1973 | Redwanz | 317/101 CM |
| 3,825,874 A | 7/1974 | Peverill | 339/14 R |
| 3,827,056 A * | 7/1974 | Vano | 346/74 E |
| 3,851,859 A * | 12/1974 | Karp | 259/6 |
| 3,852,700 A | 12/1974 | Haws | 339/14 R |
| 3,905,013 A | 9/1975 | Lee | 340/52 D |
| 4,056,299 A | 11/1977 | Paige | 339/95 D |
| 4,362,350 A | 12/1982 | von Harz | 339/143 R |
| 4,407,552 A | 10/1983 | Watanabe et al. | 339/143 R |
| 4,435,740 A | 3/1984 | Huckabee et al. | 361/398 |
| 4,440,463 A | 4/1984 | Gliha, Jr. et al. | 339/14 R |
| 4,629,269 A * | 12/1986 | Kailus | 339/59 M |
| 4,703,984 A | 11/1987 | Mitchell, Jr. | 439/70 |
| 4,729,743 A | 3/1988 | Farrar et al. | 439/276 |

(List continued on next page.)

FOREIGN PATENT DOCUMENTS

| | | |
|---|---|---|
| DE | 1 932 380 | 1/1991 |
| GB | 1 204 795 | 9/1970 |
| JP | 55021 162 | 2/1980 |
| JP | 04206179 | 7/1992 |

Primary Examiner—Hung V. Ngo
(74) Attorney, Agent, or Firm—Jeffrey D. Myers (57) ABSTRACT

A device and method wherein electrical components are mechanically suspended and electrically interconnected in an insulative elastomeric body, such as silicone, thereby eliminating the need for a circuit board or other circuit substrate. The device can change shape through compression, distension, flexure, and other external forces while maintaining its electrical performance and mechanical integrity. The device can be compressed and deformed to fit snugly within another device, such as the shell of an electrical connector or a plastic clamshell, simultaneously creating spring forces for reliable electrical contacts and an environmental seal. Accordingly, the device and method can be used for a wide variety of purposes such as electrical filtering for avionics, computer or automotive connectors, or a non-intrusive manner to package electronics for medical implants.

34 Claims, 11 Drawing Sheets

U.S. PATENT DOCUMENTS

| | | | |
|---|---|---|---|
| 4,820,174 A | | 4/1989 | Farrar et al. ................... 439/95 |
| 4,918,814 A | * | 4/1990 | Redmond et al. ............. 29/878 |
| 4,954,089 A | | 9/1990 | Jensen et al. ................. 439/76 |
| 4,979,904 A | | 12/1990 | Francis ....................... 439/108 |
| 4,993,964 A | | 2/1991 | Trummer .................... 439/272 |
| 5,014,162 A | | 5/1991 | Clark et al. ................. 361/412 |
| 5,092,788 A | | 3/1992 | Pristupa, Jr. et al. ....... 439/225 |
| 5,112,253 A | * | 5/1992 | Swift ......................... 439/620 |
| 5,134,252 A | | 7/1992 | Himeno et al. ............. 174/268 |
| 5,149,274 A | | 9/1992 | Gallusser et al. ............. 439/76 |
| 5,181,859 A | | 1/1993 | Foreman et al. ............. 439/225 |
| 5,183,698 A | | 2/1993 | Stephenson et al. ........ 428/209 |
| 5,194,010 A | | 3/1993 | Dambach et al. ............. 439/79 |
| 5,220,488 A | | 6/1993 | Denes ........................ 361/398 |
| 5,226,220 A | * | 7/1993 | Gevas et al. .................. 29/605 |
| 5,241,454 A | | 8/1993 | Ameen et al. ............... 361/744 |
| 5,290,191 A | | 3/1994 | Foreman et al. ............. 439/225 |
| 5,686,697 A | | 11/1997 | Miller et al. ................ 174/52.2 |
| 5,732,486 A | * | 3/1998 | Rapisarda .................... 36/137 |
| 5,774,048 A | * | 6/1998 | Achterholt .................. 340/447 |

* cited by examiner

ELECTRICAL CIRCUIT SUSPENSION SYSTEM

"This is a divisional Ser. No. 08/369,377 filed on Jan. 6, 1995" Now U.S. Pat. No. 5,686,697

BACKGROUND OF THE INVENTION

1. Field of the Invention (Technical Field)

The present invention relates to electronics packaging devices and methods.

2. Background Art

Electrical circuits and components are typically formed or placed on dielectric substrates. Substrates such as silicon, ceramic, FR-4, plastic, and Kapton form a stable, flat, rigid platform and thus reduce the complexity of forming or assembling complex electrical circuits. When the substrate is FR-4 or a similar glass-epoxy dielectric, the term "circuit-board" is commonly used for the assembly consisting of many electrical components affixed to the substrate and interconnected electrically by traces on the surface of the substrate. When moderately flexible dielectric substrates like Kapton are used in a similar way, the resulting assembly is often referred to as a "flex circuit." For a silicon or similar semiconductor substrate, electrical circuits are etched directly onto the surface of a rigid semiconductor substrate, and the terms "wafer" and "die" commonly apply to the resulting assembly. Electrical components are typically placed on the surface and then soldered in-place to conducting traces usually etched in the surface of the substrate. Finally, these substrates with circuits on board are typically mounted in an enclosure via fasteners through the substrate or direct bonding of the substrate to an enclosure or other similar means which offers mechanical protection.

As a result of the general use of these substrates, however, known methods of packaging electrical circuits create many undesirable constraints for applications where space, weight, and shape are fundamentally important or where it is desirable to have the electronic package change shape, dimension, size, and/or volume during installation or use. For example, existing circuit assemblies (circuit boards, wafers, and flex circuits, hereafter collectively referred to as circuit-boards) cannot be compressed, distended, twisted, or flexed into any desired shape (flex circuits offer a very limited range of flexure only) in order to conform to the location into which they must be placed or to ease their installation. The state of the art for flex circuits is represented by U.S. Pat. Nos. 4,435,740; 5,014,162; 5,220,488; and 5,241,454.

In addition, circuit-boards must be coated after final circuit assembly with a "conformal coat" to protect the assembly from moisture, etc. and to electrically isolate components and traces on the assembly. A circuit-board provides no seal for the place where it is installed; if a seal is required, it is incorporated as a separate part of the place where the circuit-board is installed.

The present invention removes these constraints while it provides additional functionality and advantages for many applications. The present invention further accomplishes the functionality of existing circuit-boards without introducing a substrate. Since it uses no substrate, it does not constrain circuit elements to any plane or surface, and it is extremely flexible, stretchable, distensible, and compressible.

There is an existing commercial and industrial need to prevent harsh environmental factors (such as water/humidity, corrosive solutions, oils, etc.) from passing through electrical connectors into sensitive electrical equipment. Some high-end military standard connectors, like MIL-C-38999 connectors, incorporate silicone rubber interfacial seals to address this market need. Many standard off-the-shelf connectors do not incorporate such seals except as a custom feature or option. Sometimes the need for such seals is only discovered after electrical equipment is sold and used by the consumer in the real-world, and the manufacturer must then retrofit field units and modify units in production to add a seal, usually by changing out connectors. The state of the art for such seals is represented by U.S. Pat. Nos. 2,450,528; 2,451,516; 3,004,170; 4,629,269; and 4,993,964.

There is a similar, and often simultaneous, need for methods and products that filter or attenuate electrical noise, transients, and other disturbances on electrical conductors passing through electrical connectors. There are a wide variety of existing devices to serve this need. Existing devices fall into two basic categories: 1) filtering/transient limiting devices that are added to existing/ordinary-unfiltered connectors; 2) filtering/transient limiting devices that are only applicable for use with special connectors designed to accept them.

Prior art for devices of the add-on sort include U.S. Pat. Nos. 5,181,859 and 5,290,191 as well as 5,183,698 and 4,979,904. Prior art for devices of the second category (where the devices are integral parts of special connectors or are where the device is a special connector) include U.S. Pat. Nos. 5,194,010; 5,149,274; 5,134,252; 5,092,788; 4,954,089; 4,820,174; 4,729,743; 4,703,984; 4,440,463; 4,407,552; 4,362,350; 4,056,299; 3,905,013; 3,852,700; 3,825,874; 3,780,352; 3,670,292; 3,569,915; and 3,086,188.

The above devices include drawings of parts that "look" similar to the present invention to a casual observer (a bathtub drain cover shares this same look). Inspection of these references reveals that many of the look-alike parts are simply solid metal foils (e.g., variations of the common bathtub drain cover) that act as ground paths for electrical energy, so there is no packaging of electrical parts at all. The remainder of the look-alike parts all share a common thread: they use substrates as their basic design element. None discloses or suggests the possibility of an insulating elastomeric suspension system, nor the combination of an electrical packaging method and an environmental seal method, nor the use of an elastomeric substance to provide the "springiness"required to ensure a reliable reusable electrical contact between the part and the host connector. Furthermore, none realize the utility of a flexible, twistable, distensible, and compressible device that: (1) can accommodate variations in the host connector (such as pin locations, shell diameter, mating tolerances) for an improved fit; (2) eases the installation/removal process since the device can readily change shape as required during the process to minimize insertion and removal forces; and (3) survives large temporary pin misalignments (which commonly occur in the real-world due to severe shock or vibration or other trauma to the connector) without degradation of the contacts, seal, or other features.

Therefore, none of the known existing devices provide the capability to simply retrofit or modify existing (ordinary) electrical connectors to obtain the desired filtering or transient attenuation and at the same time add (or preserve their existing) environmental seal within the connector. Few existing devices provide the "add-on" capability, none provide the "add-on"capability for connectors with common pin misalignments, and none provide (or preserve) the seal capability. None of the known "add-on"devices can adapt to the range of real-world variations and severe treatment encountered in existing connectors, such as misaligned pins, connector manufacturer-to-manufacturer variations, and severe temporary pin displacement caused by vibration, mechanical shock, or other connector trauma. For example, all of the "add-on" devices use either a tight press-fit connection or a spring-finger connection to the connector pins. In the press-fit case, even slight pin misalignment will prevent installation of the device, or will damage the device if it occurs after installation. The spring-finger devices use "springy" metals like BeCu, which by nature are easily permanently deformed (or "sprung" in layman's terms) once bent beyond a narrow operating range, as when a pin is temporarily bent out of position by shock or vibration, or when the device is installed onto misaligned, out of tolerance, or out of place pinb.

SUMMARY OF THE INVENTION
(DISCLOSURE OF THE INVENTION)

The present invention is of a device and method for suspending, interconnecting, and protecting circuitry comprising: an electrically and mechanically insulative body that changes shape and dimension when subjected to external forces; and circuitry suspended by the body and comprising electrical interconnects permitting components of the circuitry to move with respect to each is other as the body changes shape. In the preferred embodiment, the circuitry may be suspended within and/or on the body and the electrical interconnects are provided with slack or stretchable conductors. The body may comprise one or more openings therein having a conductor protruding into the opening from the body, such as a contact for making electrical connection to an external conductor inserted into the opening, and the body exerts compressive forces to push the contact against the external conductor. The body may also comprise one or more conductors protruding from an edge of the body, such as a contact for making electrical connection to an external conductor touching the edge, wherein the body exerts compressive forces to push the contact against the external conductor. The body preferably changes shape and dimension by being flexible, distensible, and compressible. It may be an elastomer, such as silicone, RTV silicone, heat-cured silicone, two-part silicone, latex, and rubber, or one or more materials selected from the group consisting of clays, gums, and foam rubbers.

The invention is also of a device and method for adding and connecting circuitry to an electrical connector, comprising: an electrically and mechanically insulative body that changes shape and dimension so that the device fits snugly about or within at least one coupling; circuitry suspended by the body and comprising electrical interconnects permitting components of the circuitry to move with respect to each other as the body changes shape; and contacts interconnected with the circuitry and protruding from the body for making electrical connection to at least one coupling. In the preferred embodiment, the body, when the device fits snugly about or within at least one coupling, creates an environmental seal preventing the passage of dust, fluids, gases, and other contaminants through the connector, the body exerts compressive forces on the contact to push the contact against at least one coupling, and the body further comprises at least one opening for fitting around a pin, wherein the diameter of the opening is smaller than the diameter of the pin when the device is not engaged to the pin, but expands to a diameter substantially equal to the diameter of the pin when the device is engaged to the pin. The circuitry may be suspended within or on the body. The electrical interconnects may include slack or stretchable conductors. The body changes shape and dimension by being flexible, distensible, and compressible, and may be an elastomer, such as silicone, RTV silicone, heat-cured silicone, two-part silicone, latex and rubber, or one or more materials such as clays, gums, and foam rubbers. The contacts preferably shift position due to the changes in the body to accommodate out of alignment couplings. The diameter of the body is preferably approximately 5% to 15% greater than the inner diameter of the connector. The contacts are preferably made of conductive wire or ribbon. The device may comprise external contacts disposed on an edge of the body, wherein at least one of the external contacts connects the circuitry to an outer shell of the connector. The circuitry may comprise electrical components selected from the group consisting of capacitors, resistors, MOVs, diodes, fuses, antifuses, shorting blocks, inductors, active electronic components, and any combination thereof. The device may thus be created with circuitry so as to filter electromagnetic interference. Or, the circuitry may comprise a network of ground buses electrically connecting a plurality of chip capacitors to an outer shell of the connector, each of the chip capacitors being electrically connected to one of the contacts. Alternatively, the circuitry may comprise electrical transient limiting circuitry.

A primary object of the present invention is to provide a means to package and interconnect electronic components using a mechanically and electrically insulative body to suspend the components and interconnects in such a way that they are free to move with respect to each other without degradation in performance as the shape, dimension, size, and/or volume of the body change during installation and use of the invention.

Another object of the present invention is to provide electrical interconnections suspended within the insulative body with sufficient slack and malleability to accommodate three-dimensional movement of individual components and contacts without functional degradation.

A further object of the present invention is to exploit a change in shape resulting from normal installation or use which allows it to perform important functions peripheral to the main electrical purpose, such as environmental sealing and/or enabling electrical contacts.

Another object of the present invention is to provide to an electrical connector an electrical device which filters or attenuates electrical noise, transients, and other disturbances and which simultaneously acts as an environmental seal.

A primary advantage of the present invention is that its body can be compressed, distended, deformed, and flexed during use without degrading its electrical functionality.

An additional advantage of the present invention is that it can adapt to a wide range of real-world conditions, such as misaligned connector pins, manufacturer variations, severe temporary pin displacement, and other trauma.

Another advantage of the present invention is that it provides the functionality of existing circuit-boards without introducing a substrate or wafer.

Yet another advantage of the present invention is that connectors both in the field and under manufacture may be easily modified to provide an environmental seal and an electrical functionality, such as transient filtering.

Still another advantage of the present invention is that its body may be constructed using an optically clear or translucent suspension material to assist in installation or to allow viewing of components within or behind the body.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS (BEST MODES FOR CARRYING OUT THE INVENTION)

The preferred embodiments suspend electrical circuits in an insulative elastomeric body that changes shape, size, and volume during use, thereby providing the springiness required for electrical contacts, creating an environmental seal, or simply accommodating change of shape required during its use or installation, in addition to its electrical function. The preferred embodiment is essentially an insulative elastomeric body (e.g., silicone, RTV silicone, heat-cured silicone, two-part silicone, latex, rubber, clay, molding material, or other flexible or elastomeric materials) with an electrical circuit suspended within it (alternatively disposed on it), as will be further described. The transformable material freely suspends the electronics and interconnections, simultaneously providing: (1) mechanical interconnection and protection for all parts of the electrical circuit; (2) insulative properties; (3) a conformal coat for all parts of the electrical circuit, except interface connections which protrude from the transformable material; (4) a distensible and compressible environmental seal for the place where the device is installed (e.g., like a rubber gasket); and (5) a method for ensuring electrical contact from the invention (e.g., a "springiness" of the transformable material under compression to force protruding electrical contacts against corresponding external electrical contacts, such as pins). In addition, the present invention can literally be stretched, twisted, flexed, distended, and compressed as needed to install it in its host location or to fit in its host location, or to adapt to physical changes in the host location during use.

The body, as will be understood by those skilled in the art, may be any material that is non-conducting and transformable, i.e., flexible, and distensible and deformable under compression. Such materials include elastomers (such as silicone and latex) and formable and shapeable materials such as clay, gum, and foam-rubber.

The utility of the invention, and its superiority to existing methods and devices, may be understood by examining its application in an area where the existing technology does not adequately address existing needs, namely, interface protection. Interface protection consists of the need to isolate electrical equipment from both electrical and environmental factors such as electrical noise/transients and water/humidity respectively.

This embodiment of the present invention is essentially a collection of electrical components wired together and suspended in an elastomeric material, shaped to fit snugly within a specific place (such as between a specific type of mating electrical connectors), with electrical contacts protruding from the elastomeric material to provide a reliable, re-usable connection to the outside world (like the selected pins and/or the shell of the connector) by using the elastomeric material to obtain the required "spring" force for the contacts. The present invention can be easily, and virtually instantly, added to any common connector to obtain electrical filtering, transient limiting, and an environmental seal. Since the present invention is flexible, twistable, distensible, and compressible, it readily adapts to normally unacceptable variations in the host location, such as pin misalignment, manufacturing tolerances, and manufacturer-to-manufacturer variations.

Figure 1:
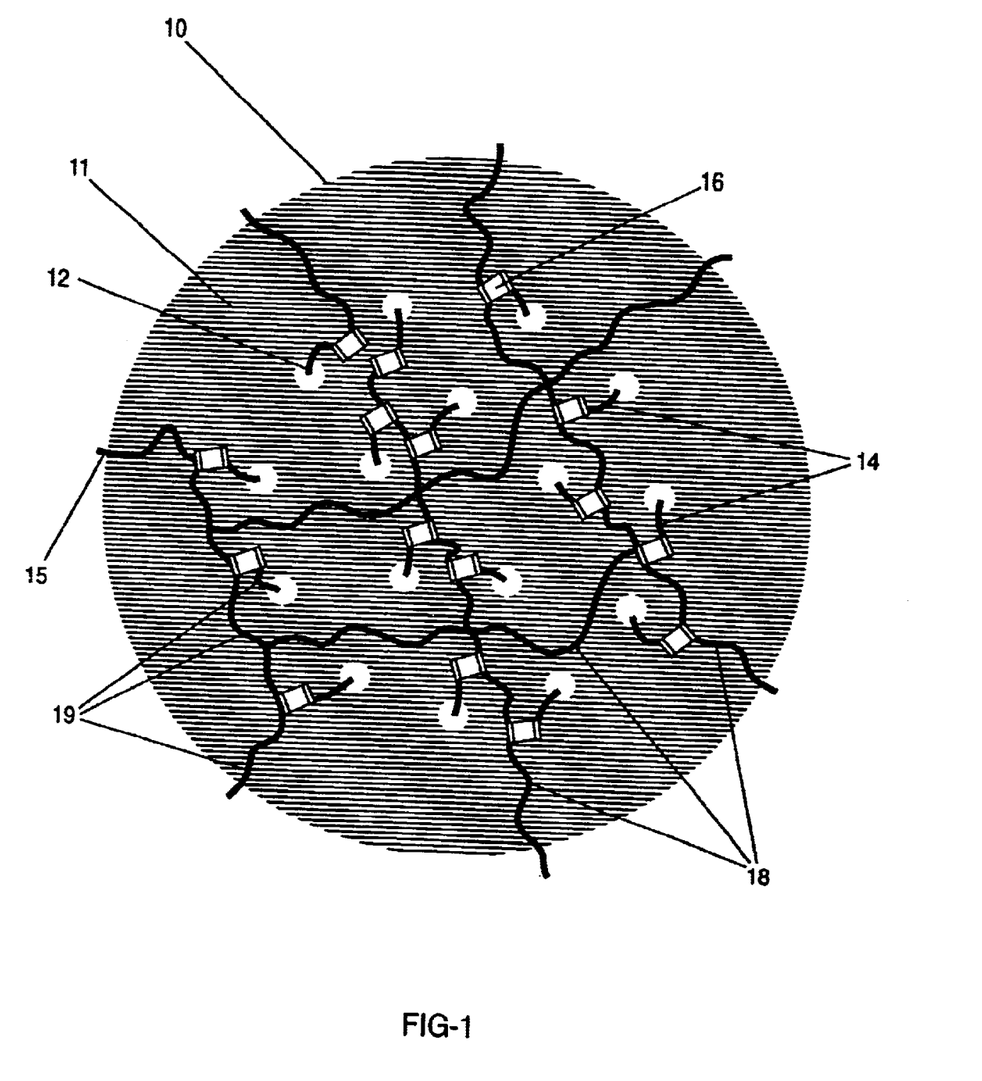
FIG. 1 is a top view of an embodiment of the invention useful for a typical low density connector.

Referring to FIG. 1, the invention may be applied to a typical low density connector. Device 10 comprises a circular body 11, within which are contained openings 12, pin contacts 14, shell contacts 15, electrical components 16, and ground buses 18. Body 11 is preferably formed of silicone rubber or other elastomeric material. Openings 12 contain pin contacts 14, which are formed of any suitable conductor, such as 1 mil to 10 mil diameter copper wire (optionally plated with gold, tin, or silver), or flat wires such as 5 mil×1 mil Au ribbon, or most preferably gold plated annealed copper wire (3 mil diameter). Ground buses 18 interconnect electrical components 16, which may be capacitors (e.g., 0402 to 0603 chip capacitors), MOVs, diodes, shorting blocks, resistors, fuses, integrated circuits, memory storage devices, and the like. Ground buses 18 are preferably formed of 42 AWG Cu wire or 5 mil×1 mil-Au ribbon. Extra ground buses may be provided as needed for adequate RF performance of the device. Ground buses 18 electrically connect to the plug shell of the connector via shell contacts 15 which protrude slightly from the edge of body 11. Shell contacts 15 may be formed of materials identical to pin contacts 14. Slack sections 19 (or devices such as stretchable conductive silicone conductors) are preferably provided to ground buses 18 and pin contacts 14 so that electrical connections are not torn when body 11 is stretched, compressed, twisted, bent, or otherwise contorted. Individual electrical components are thereby permitted to move with respect to each other and with respect to the environment external to body 11.

Figure 2:
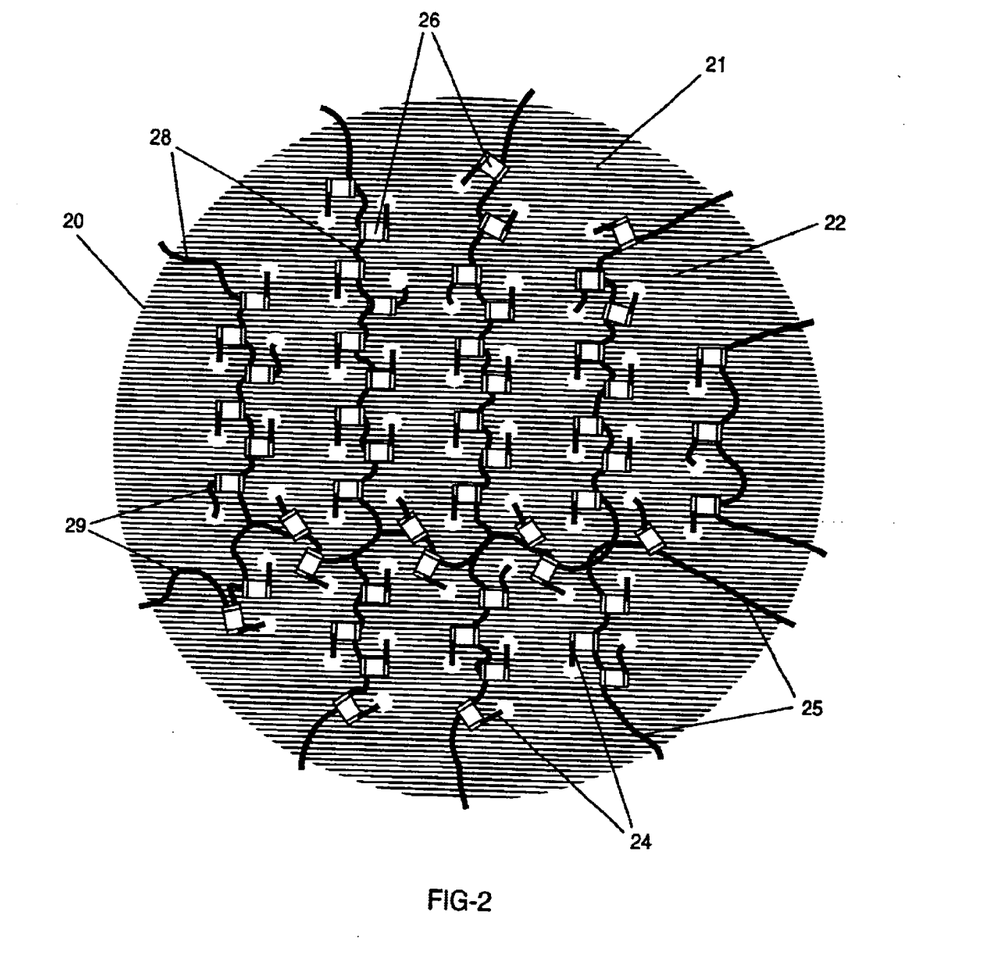
FIG. 2 is a top view of another embodiment of the invention useful for a typical high density connector.
Figure 7:
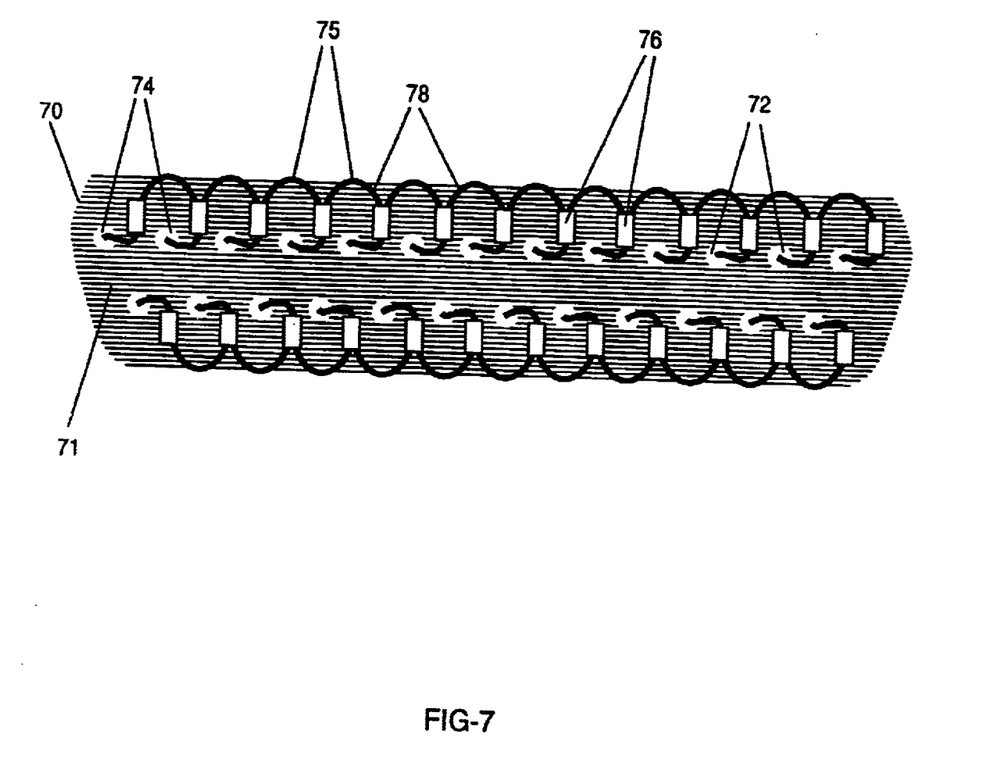
FIG. 7 is a top view of an embodiment of the invention useful for a DSUB25 connector.

Referring to FIG. 2, the invention may also be applied to a typical high density connector. Device 20 comprises a circular body 21, within which are contained openings 22, pin contacts 24, shell contacts 25, electrical components 26, ground buses 28, and slack sections 29. In this embodiment, pin contacts 24 preferably are formed of 2–5 mil Au plated Cu. Referring to FIG. 7, the invention may also be applied to a DSUB25 connector. Device 70 comprises an oblong body 71, within which are contained openings 72, pin contacts 74, shell contacts 75, electrical components 76, and ground buses 78. As will be understood by one skilled in the art, the invention can be practiced with any connector type, including Centronix, power plugs, and various plastic automotive connectors.

Figure 3:
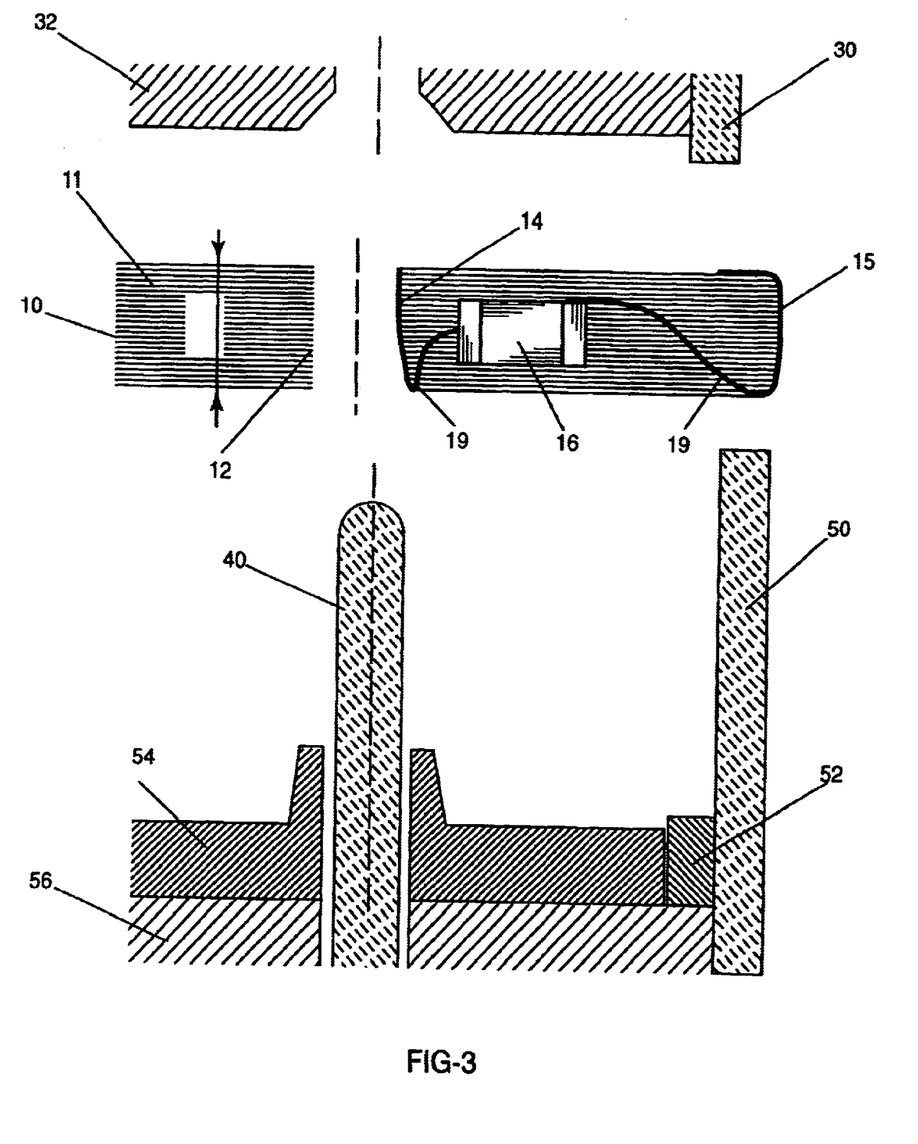
FIG. 3 is a partial cut-away side view of the embodiment of FIG. 1 just prior to installation.
Figure 4:
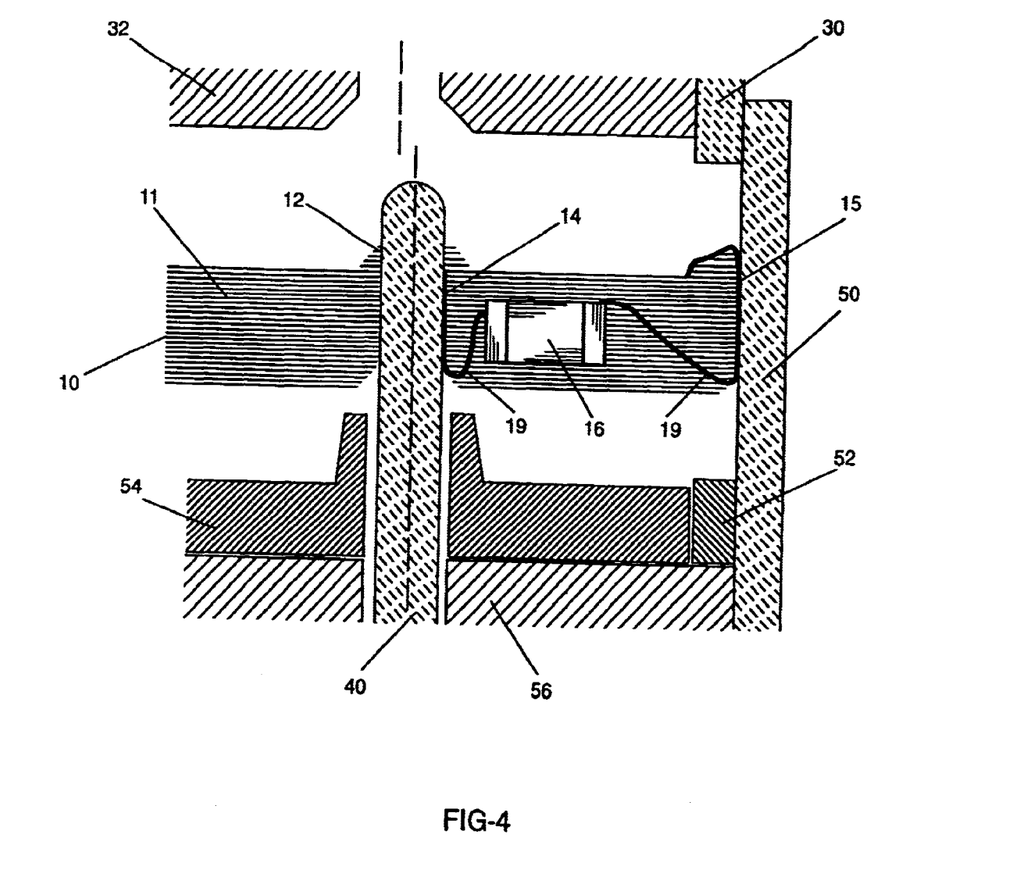
FIG. 4 is a partial cut-away side view of the embodiment of FIG. 1 during installation but prior to full connector mating.
Figure 5:
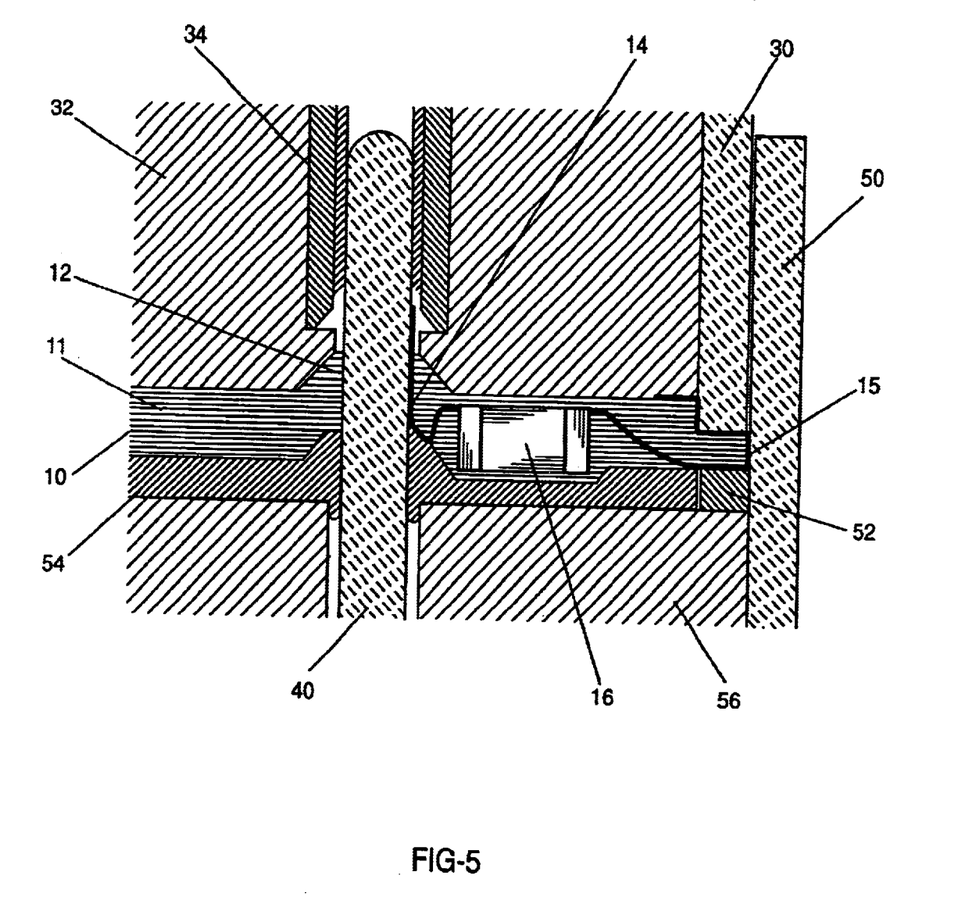
FIG. 5 is a partial cut-away side view of the embodiment of FIG. 1 when installed and after full connector mating.

Of the many advantages of the present invention, one of the most important is the creation of a durable, re-usable electrical contact having no spring that can wear out, that is sealed from water, humidity, and the like, and that can adapt to a wide range of varying conditions including out of place pins and severe vibration and mechanical shock. FIGS. 3–5 illustrate the embodiment of FIG. 1 being installed between male and female connector assemblies, FIG. 3 showing the devices before installation, FIG. 4 during installation, and FIG. 5 after installation. The female connector assembly comprises receptacle shell 30, receptacle plastic 32, and socket 34. Male connector assembly comprises pin 40, plug shell 50, perimeter interfacial seal 52, plug interfacial seal 54, and plug plastic 56.

The present invention's contacts are implemented by sizing the inner hole diameter of openings 12 in body 11 so that the inner hole diameter is 10% to 50% smaller than the diameter of pin 40 which passes through it upon installation. (However, openings may be made so small that it self closes via latent compressive forces in the silicone body. This is useful where one wants to maximize the contact force or where one must seal around and make contact to a pin or shell with a wide size variation.) Since the location of pins 40 changes with time due to external forces applied to the connector, there is no way to accurately know their positions at any given time. Thus, the as-built locations of pin openings 12 are in the general proximity of the pin locations, preferably not more than two pin diameters away. In use (upon installation), the locations of pin openings 12 need not align with (and in practice usually will not align with) but self-adjust to obtain and maintain alignment with the ever changing locations of pins 40. A small conductive wire or ribbon—pin contact 14—protrudes from body 11 into opening 12 and proceeds along the inner edge of the opening. Thus, when the seal is installed, pin contact 14 is forced against pin 40 by the compression of the body caused by a pin too big to fit into the opening unless the body compresses and the opening expands. Shell contacts 15 work on a similar basis to pin contacts 14, since the outer diameter or perimeter of body 11 is preferably 5% to 15% larger then the inner diameter of plug shell 50.

This force alone is adequate to obtain a good electrical contact under nominal environmental conditions. However, the force is greatly increased by the final overall compression of the seal during final mate of the host connectors (see FIG. 5), significantly improving the connectors' performance under severe environmental stress (vibration, shock, corrosion, etc.). Note that when the pair of host connectors is completely mated, this last few millimeters of movement will compress body 11 of the present invention between the mated connectors, resulting in the enhanced compression force around each pin. This is a key feature since this increased force is not present during installation or removal of the present invention, thus reducing the effort required to install and remove it.

Figure 6:
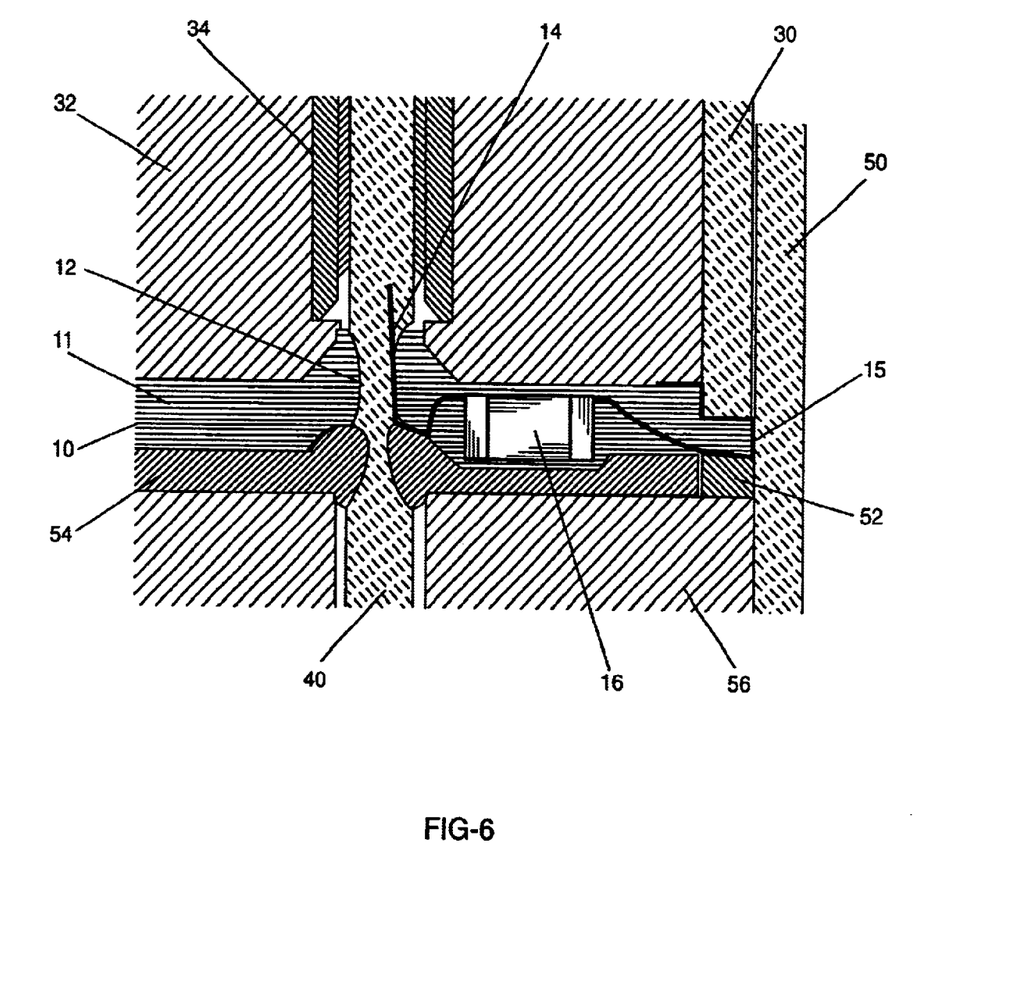
FIG. 6 is a partial cut-away side view of the embodiment of FIG. 1 when installed but where no pin is installed.

This final compression effect can perhaps be more easily visualized by reference to FIG. 6, which shows the position of a pin opening and contact after a connector pair is fully mated but without a pin installed in the opening. Note that the contact is pushed well into the space 42 normally occupied by the pin because the seal, under compression, is distended into areas under no, or less, compression.

It is important to see that unlike existing metal-spring and pressed-fit type contacts, the contact concept of the present invention works even when a pin is severely misaligned or misplaced or even when a pin is temporarily bent well out of place. While existing devices will incur permanent damage due to major misalignments that frequently occur in practice during their installation, use and removal, the present invention accommodates these conditions by simply flexing into position as dictated by the pin location.

Electrical components and wiring/interconnections within the elastomeric material seal are not constrained to any surface, plane, layer, or recess in a substrate as is the case with existing devices. The components can be anywhere and in any orientation within or on the elastomeric material, with the only constraint deriving from the need to maintain proper electrical isolation between adjacent components and interconnections. This results in a more efficient use of available space as well as relaxed manufacturing requirements. Interconnections can be accomplished by simple point-to-point wiring between components and pins, using solder, wire bonding, or conductive epoxy to bond wires to components. As noted earlier, slack in wires or stretchable conductive silicone conductors may be used to permit maximum contortability of the device without tearing of electrical connections within the device. This freeform structure allows the transformability desired once the circuitry is suspended in the elastomeric material.

Another major advantage of the elastomeric material suspension system is the isolation it provides for the suspended components. Once installed in a connector, the present invention provides excellent mechanical isolation from vibration and mechanical shock for the suspended electrical circuitry, especially when compared with all existing devices which place the electrical circuitry and/or its substrate in intimate contact with hard surfaces of the connector.

For retrofit applications, the present invention is installed into a connector that typically already has its pins installed (see FIG. 4). Thus, the present invention is installed by slipping it into the male connector, whereupon the pin openings shift positions (by deforming the elastomeric body) to accommodate out of alignment pins and the pin openings expand to accommodate the larger diameter of the pins and the outer diameter of the seal is compressed to fit within the smaller diameter of the connector shell. The present invention can be semi-permanently glued to the mating surface of the connector with, e.g., silicone rubber RTV, but this is not essential in that the device will stay in place without glue due to the forces exerted on the pins and the shell from the compression of the elastomeric material. This installation process is the same whether or not the connector has an existing interfacial (environmental) seal; the present invention will preserve the environmental seal for connectors that already have one and will create an environmental seal for connectors without one.

The present invention may also be used to physically replace any elastomeric material component within a connector (or any other device), which will permit heightened functionality of the connector depending on the electrical circuitry within the body of the invention. During manufacture of a connector, a device according to the present invention may be installed in place of an elastomeric material component without any need for retooling. Perhaps the most evident elastomeric material components that may be so replaced are the seals in the back of male or female connectors and the plug interfacial seal of a, male connector.

For new connectors, without pins installed, the present invention is installed in the empty male connector shell, compressing the outer diameter of the seal. In this case it is recommended that the seal be semi-permanently glued in place using a suitable glue, such as silicone rubber RTV. Later, when the pins are installed in the connector, they will expand the pin openings in the seal, again creating the required environmental seal and compression forces needed to activate the electrical contacts.

An example of this use would be to affix the present invention to a MIL-C-38999 type connector instead of the normal interfacial seal to upgrade an unfiltered connector with a seal to a filtered connector with a seal. The result would be a connector that looks and performs just like a standard (unfiltered) connector except it would now be upgraded to a filtered/transient limiting type. This straightforward modification will allow a connector manufacturer or value-added reseller to add filter connectors to their product line at an extremely low cost, with no change in their production tooling and achieving a much greater commonality between unfiltered and filtered connectors than is the case with existing devices. For this application, each of the electrical components within the body of the invention is preferably an 0402 to 0603 chip capacitor.

The body of the present invention is preferably clear so that the electrical components may be viewed within, which permits visual inspection (either human or automated) to determine certain faults. Alternatively, the body may be easily dyed any desired color by simply adding dye to the silicone, which permits color-coding of components for easy visual identification.

The present invention can be used to perform a variety of electrical functions by simply changing the electrical circuitry contained within the device. For example, replacing the capacitors with diodes or metal oxide varistors (MOVs) in surface mount (SMT) form creates a transient limiting device useful to protect an electrical device from electrostatic discharge (ESD), lightning, and other common electrical transients. As another example, the invention may be used to free up valuable internal circuit board space of an electrical device by placing various parallel electrical interface components within the invention instead of on the internal circuit board. Since the space within the connector is typically thought of as wasted space, placing the components in the invention instead of on an internal circuit board may be more cost effective and/or may allow the host electrical device to be smaller. Another example is the use of the present invention as a sensor for the voltage and current on pins within a connector. In this case, the invention can contain various sensing circuitry such as magnetoresistive current sensors, calibrated fuses or antifuses placed between pins and other pins or the connector shell, and/or other simple memory circuits as are commonly used (such as flip-flops, programmable gate arrays, etc.). By way of these examples it is clear that the present invention may contain any combination of electrical components familiar to those skilled in the art as it exists now or in the future.

The present invention can also be used advantageously as an alternative way to add electronics in "clamshell" type enclosures commonly used for products like watches, automobile key fobs, calculators, and the like. The advantages over traditional packaging include: (1) electronics and interconnects are environmentally sealed by virtue of being totally contained within the elastomeric material (preferably silicone); (2) a peripheral environmental seal for the housing can be achieved simply by compressing the elastomeric material between the two halves of the clamshell; (3) a circuit board is not needed; (4) thermal and mechanical isolation of electronics and interconnects is provided; and (5) contact means to the battery (and other separate components as required) can be achieved by using the compressive forces within the elastomeric material to provide the spring force needed to push these contacts together (eliminating the need for fragile spring metal contacts such as BeCu that typically perform this function).

Figure 8:
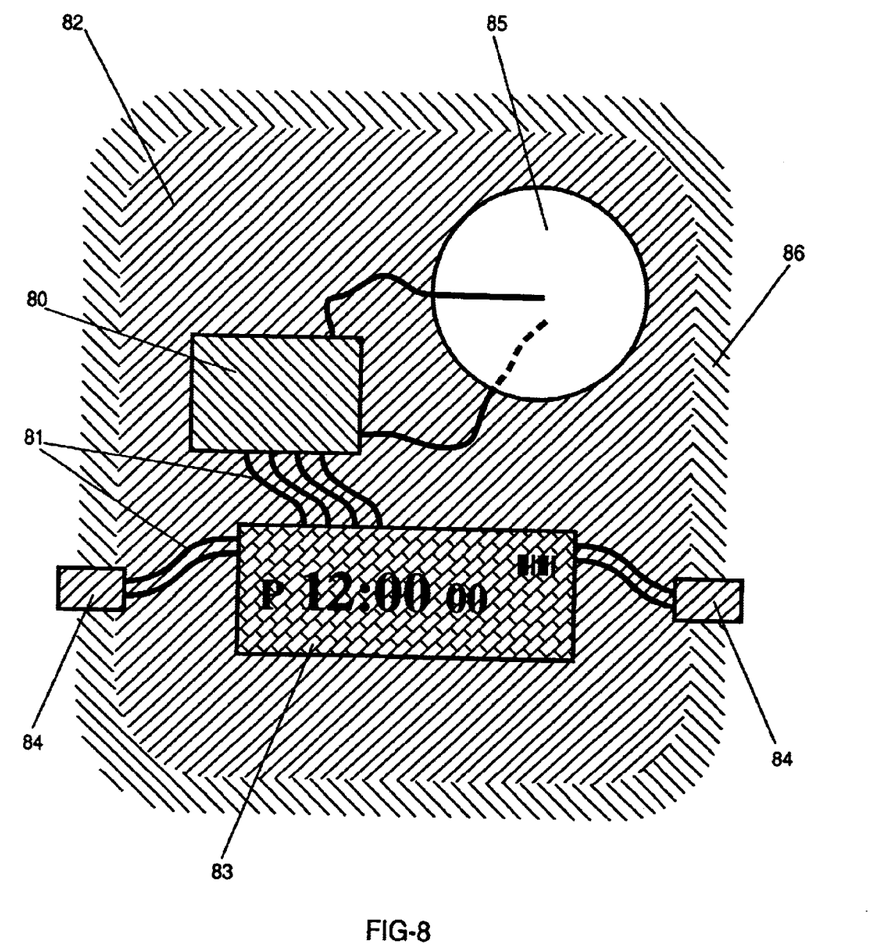
FIG. 8 is a top view of an embodiment of the invention for watch electronics.
Figure 9:
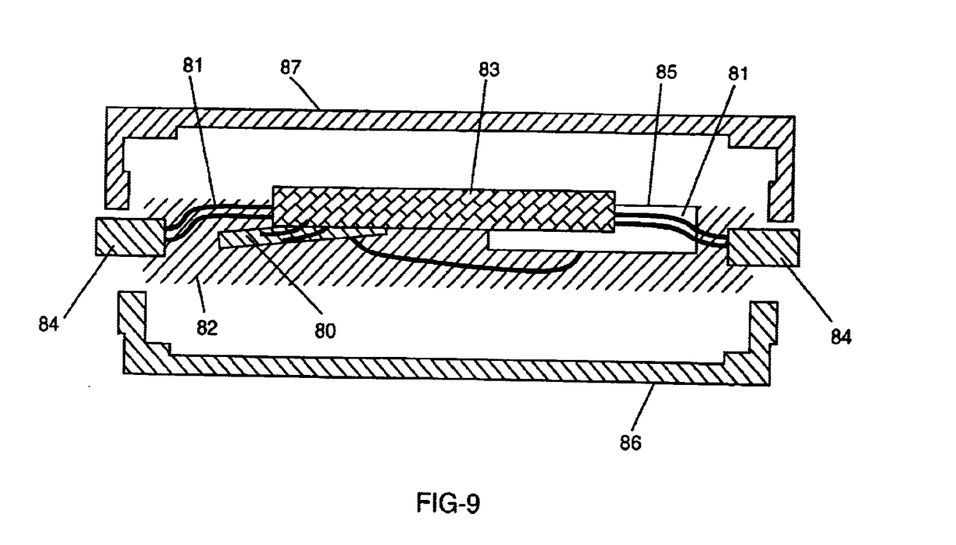
FIG. 9 is an exploded side cut-way view of the embodiment of FIG. 8.
Figure 10:
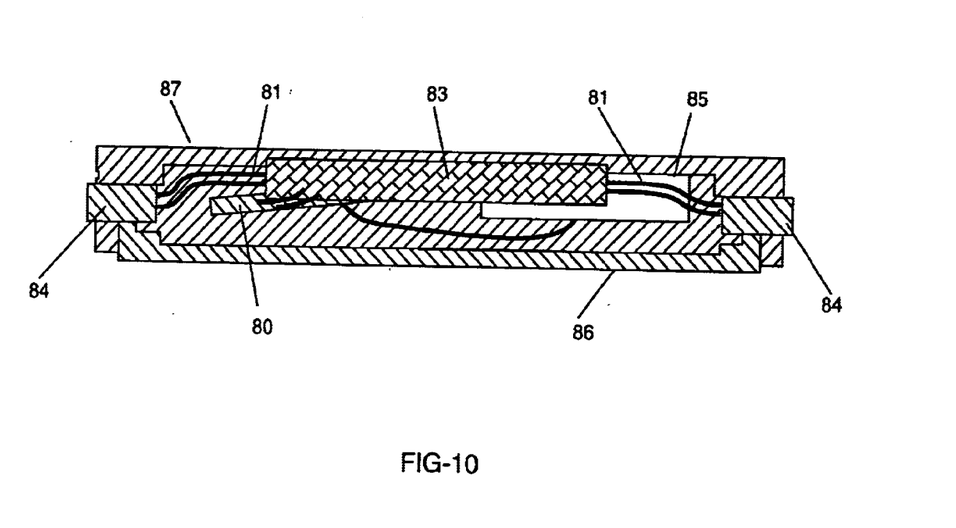
FIG. 10 is a side cut-away view of the embodiment of FIG. 8.
Figure 11:
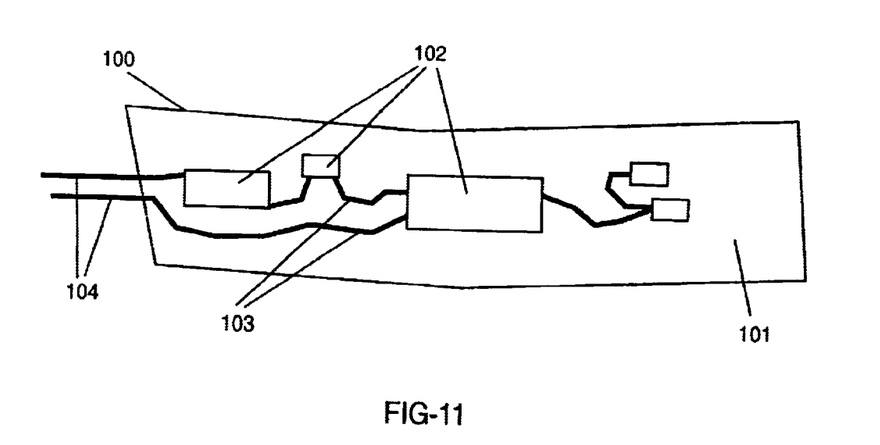
FIG. 11 is a top view of a circuit suspended according to the present invention.
Figure 12:
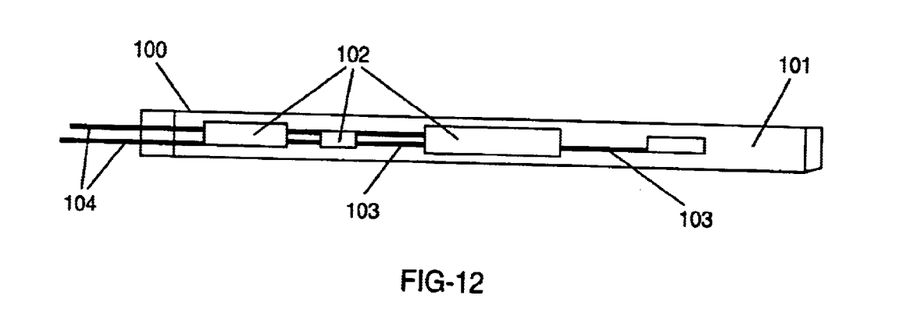
FIG. 12 is a side view of the embodiment of FIG. 11.
Figure 13:
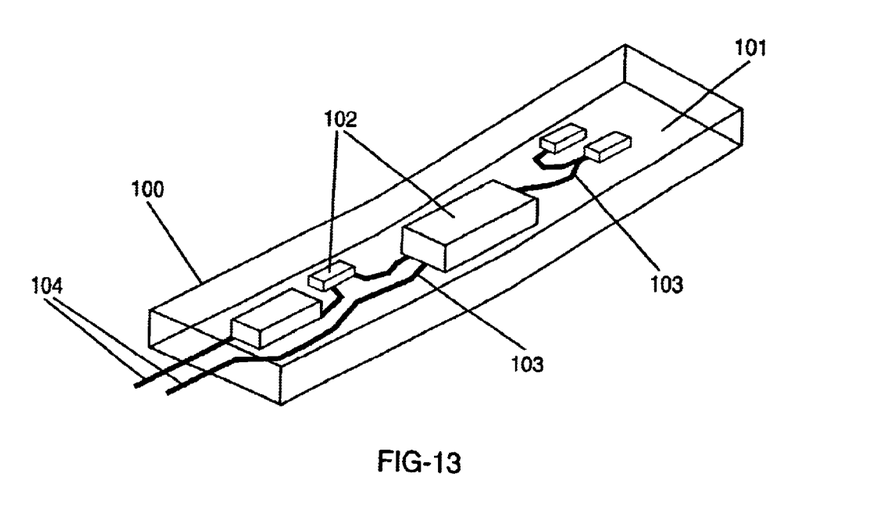
FIG. 13 is a perspective view of the embodiment of FIG. 11.

Referring to FIG. 8, watch electronics may be conveniently packaged according to the present invention. The internal watch electronics includes semiconductor chip or die 80 and electrical interconnects 81 completely suspended in elastomeric material 82 (preferably silicone). Display 83 may be placed so that the display face is exposed, or if a transparent elastomeric material is used, totally contained within the elastomeric material. Switches 84 are partially exposed to allow proper operation. A recess is formed in the elastomeric material to removably accept battery 85. Electrical interconnects 81 may be of any suitable conductive material, such as copper or gold wire or traces. They may be bare wires, due to the electrical insulation afforded by a elastomeric material such as silicone, or insulated wire, and may be connected to the electronics via soldering, wire bonding, or conductive epoxy, whichever best serves manufacturability. Interconnects are illustrated with service loops to accommodate compression of the elastomeric material and the resulting small movement of connected electronic components with respect to each other. These electronics and elastomeric material comprise a complete subassembly which is shown placed onto the lower half of clamshell 86. The watch device prior to mating of the clamshells is shown in FIG. 9. An environmental seal for the enclosure is created when elastomeric material 82 is compressed around its perimeter by clamshell top 87 and bottom 86 as they are mated, as illustrated in FIG. 10.

Figure 14:
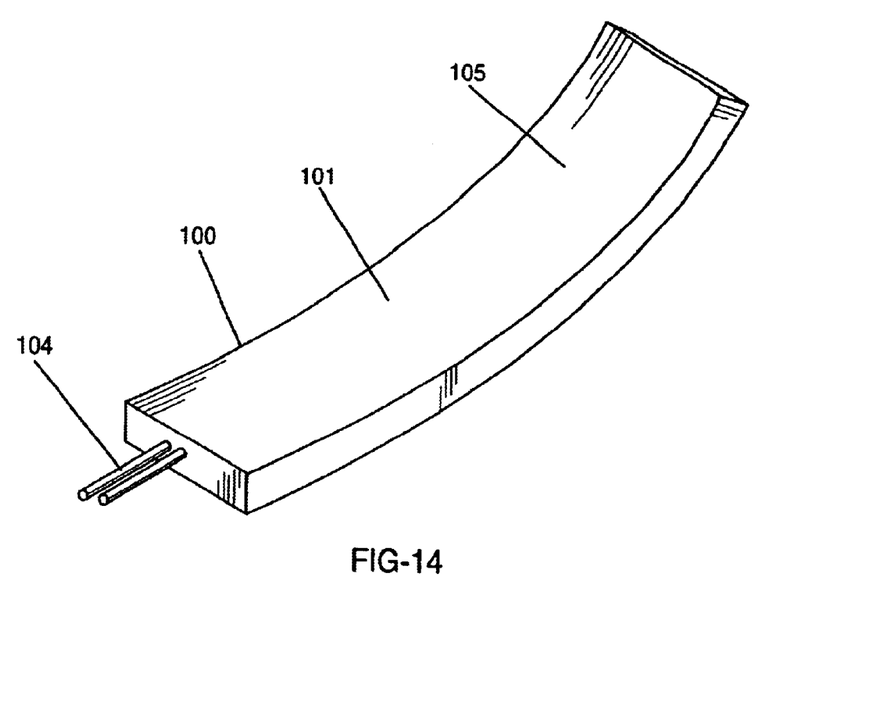
FIG. 14 is a perspective view of the embodiment of FIG. 11 which has been somewhat contorted.
Figure 15:
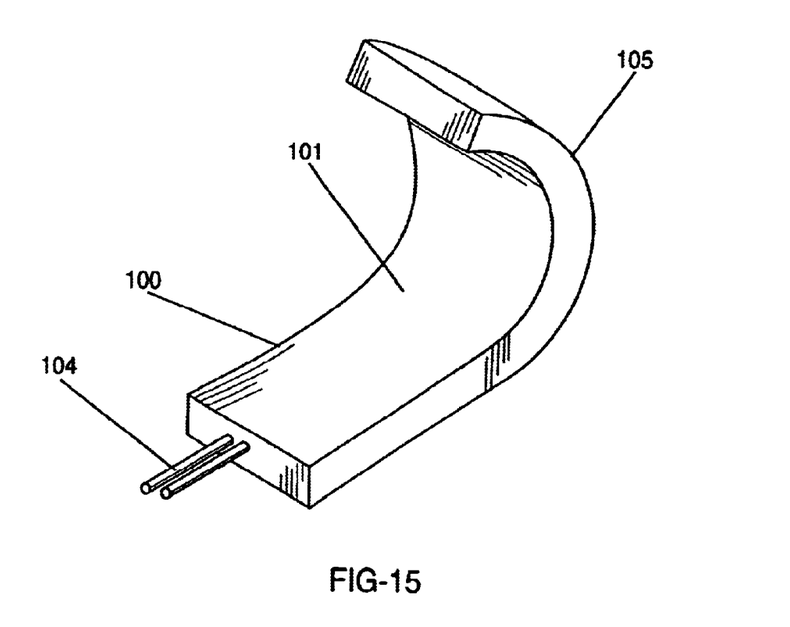
FIG. 15 is a perspective view of the embodiment of FIG. 11 which has been contorted more than in FIG. 14.

FIGS. 11–15 illustrate another device according to the present invention for packaging electronics. Device 100 comprises elastomeric material body 101 (preferably silicone) which suspends various electrical and electronic components 102 interconnected by conducting elements 103 with output and input connections obtained via contacts 104. Conducting elements 103 and contacts 104 are routed between components such that they contain residual slack, allowing the individual components to move with respect to each other as the elastomeric material body is stretched, flexed, compressed, and/or twisted during installation and use without damaging the interconnections or suspended components. FIGS. 14 and 15 show two exemplary deformations of the elastomeric material body that can be easily accommodated by the interconnecting means and components without damage. The elastomeric material body is undergoing both uneven flexure and unevenly applied compression at point 105. Note that the elastomeric material body can be completely clear, translucent, or opaque and can be dyed to any color desired during construction.

Devices according to the invention are particularly useful for implanted medical devices, where small size, adaptable shape and size, and environmental sealing are simultaneously desired. The body of the device must be such that it can be placed in direct contact with many human and animal tissues, while isolating the internal components and conducting means from the tissues and vice versa. Silicone provides a material meeting these considerations. In addition, the device may be constructed to be soft, supple, and limber so as to cause the minimum discomfort and to remain unobtrusive after implantation.

As can be seen, in addition to the above uses or applications, any circuit application which utilizes or requires a seal can benefit from the device of the present invention.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. An apparatus suspending, interconnecting, and protecting components of an electrical circuit, the apparatus comprising:
   An electrically and mechanically insulative body that changes shape when subjected to external forces;
   electrical circuit components in addition to electrical interconnects suspended by the insulative body;
   at least one electrical contact protruding from a surface of the insulative body; and
   stretchable electrical interconnects; and
   wherein the components of the electrical circuit move with respect to each other and remain in constant electrical contact as the insulative body changes shape.

2. The apparatus of claim 1 wherein the electrical circuit components are suspended within the body.

3. The apparatus of claim 1 wherein the electrical circuit components are suspended on the body.

4. The apparatus of claim 1 wherein the stetchable electrical interconnects comprise slack in wires.

5. The apparatus of claim 1 wherein the electrical contact is located at an opening within the insulative body for making an electrical connection to an external contact.

6. The apparatus of claim 5 wherein the insulative body is capable of exerting compressive forces to push the electrical contact against an external contact.

7. The apparatus of claim 1 wherein the electrical contact is located on an edge of the insulative body for making an electrical connection to an external contact.

8. The apparatus of claim 7 wherein the insulative body is capable of exerting compressive forces to push the electrical contact against an external contact.

9. The apparatus of claim 1 wherein the insulative body is capable of changing shape and dimension by being flexible, distensible, and compressible.

10. The apparatus of claim 1 wherein the insulative body comprises an elastomer.

11. The apparatus of claim 10 wherein the insulative body comprises one or more materials selected from the group consisting of silicone, RTV silicone, heat-cured silicone, two-part silicone, latex, and rubber.

12. The apparatus of claim 1 wherein the insulative body comprises one or more materials selected from the group consisting of clays, gums, and foam rubbers.

13. The apparatus of claim 1 wherein the electrical components are selected from the group consisting of capacitors, resistors, MOVs, diodes, fuses, antifuses, shorting blocks, inductors, active electronic components, and any combination thereof.

14. The apparatus of claim 1 wherein the stetchable electrical interconnects comprise conductive silicon electrical interconnects.

15. An apparatus for insulating and protecting components of an electrical circuit, the apparatus comprising:
    an electrically and mechanically insulative body that changes shape;
    electrical circuit components in addition to electrical interconnects suspended by the insulative body;
    at least one electrical contact on a surface of the insulative body interconnected with the electrical circuit to make at least one electrical connection that fits tightly against an external electrical contact due to compressive force of the insulative body; and
    stretchable electrical interconnects; and
    wherein the electrical circuit components move with respect to each other and remain in constant electrical contact as the insulative body changes shape.

16. The apparatus of claim 15 wherein at least one electrical connection can be formed by the apparatus between the electrical contact and the external electrical contact such that an environmental seal is created thereby preventing the passage of dust, fluids, gases, or other contaminants through the connection.

17. The apparatus of claim 15 wherein the insulative body comprises at least one opening for fitting around an external contact pin.

18. The apparatus of claim 17 wherein the opening comprises a diameter smaller than the diameter of the external contact pin when the insulative body is not in contact with the pin, but the opening expands to comprise a diameter substantially equal to the diameter of the pin when the insulative body is fit to the pin.

19. The apparatus of claim 18 wherein the at least one opening has a non-contact diameter approximately 5% to 15% less than the diameter of the external contact pin.

20. The apparatus of claim 17 wherein the apparatus is capable of maintaining electrical contacts which shift position due to changes in the body to accommodate variable spacings between a plurality of external contact pins.

21. The apparatus of claim 15 wherein the electrical circuit components are suspended within the body.

22. The apparatus of claim 15 wherein the electrical circuit components are suspended on the body.

23. The apparatus of claim 15 wherein the stretchable electrical interconnects comprise slack in wires.

24. The apparatus of claim 15 wherein the body is capable of changing shape and dimension by being flexible, distensible, and compressible.

25. The apparatus of claim 15 wherein the body comprising an elastomer.

26. The apparatus of claim 15 wherein the body comprises one or more materials selected from the group consisting of silicone, RTV silicone, heat-cured silicone, two-part silicone, latex and rubber.

27. The apparatus of claim 15 wherein the body comprises one or more materials selected from the group consisting of clays, gums, and foam rubbers.

28. The apparatus of claim 15 wherein the electrical contact comprises conductive wire or ribbon.

29. The apparatus of claim 15 wherein the electrical contact is on a surface of the insulative body and makes electrical contact to an external outer shell electrical contact.

30. The apparatus of claim 15 wherein the electrical circuit components comprise means for filtering electromagnetic interference.

31. The apparatus of claim 30 further comprising a network of ground buses electrically connecting a plurality of chip capacitors to an external outer shell electrical contact, each of the chip capacitors being electrically connected to one of the external contacts.

32. The apparatus of claim 15 wherein the electrical circuit components comprise means for limiting electrical transients.

33. The apparatus of claim 15 wherein the electrical circuit components are selected from the group consisting of capacitors, resistors, MOVs, diodes, fuses, antifuses, shorting blocks, inductors, active electronic components, and any combination thereof.

34. The apparatus of claim 15 wherein the stetchable electrical interconnects comprise conductive silicon interconnects.

* * * * *